(12) United States Patent
Warner et al.

(10) Patent No.: US 7,479,843 B2
(45) Date of Patent: Jan. 20, 2009

(54) RADIOFREQUENCY ATTENUATOR AND METHOD

(75) Inventors: Benjamin P. Warner, Los Alamos, NM (US); T. Mark McCleskey, Los Alamos, NM (US); Anthony K. Burrell, Los Alamos, NM (US); Anoop Agrawal, Tucson, AZ (US); Simon B. Hall, Palmerston North (NZ)

(73) Assignee: Los Alamos National Security, LLC, Los Alamos, NM (US)

( * ) Notice: Subject to any disclaimer, the term of this patent is extended or adjusted under 35 U.S.C. 154(b) by 835 days.

(21) Appl. No.: 10/990,881

(22) Filed: Nov. 16, 2004

(65) Prior Publication Data

US 2005/0126807 A1     Jun. 16, 2005

Related U.S. Application Data

(62) Division of application No. 10/357,723, filed on Feb. 3, 2003, now abandoned.

(51) Int. Cl.
    *H03H 7/24* (2006.01)
(52) U.S. Cl. .................................... 333/81 R
(58) Field of Classification Search ............... 333/81 R, 333/81 A, 81 B
    See application file for complete search history.

(56) References Cited

U.S. PATENT DOCUMENTS 4,290,779 A * 9/1981 Frosch et al. ............... 422/186

| | | | | |
|---|---|---|---|---|
| 4,412,255 A | | 10/1983 | Kuhlman et al. ............ 358/245 |
| 4,455,153 A | * | 6/1984 | Jakahi .......................... 48/62 R |
| 4,889,121 A | * | 12/1989 | Fassina ......................... 607/95 |
| 4,910,090 A | | 3/1990 | Kuhlman et al. ............ 428/469 |
| 4,978,812 A | | 12/1990 | Akeyoshi et al. ....... 174/35 MS |
| 5,827,602 A | | 10/1998 | Koch et al. .................. 429/194 |
| 6,033,620 A | * | 3/2000 | Utsumi et al. ............... 264/674 |
| 6,319,428 B1 | * | 11/2001 | Michot et al. ............... 252/500 |
| 6,353,220 B1 | | 3/2002 | Sar ............................. 250/239 |

OTHER PUBLICATIONS

J. Sun, M. Forsyth, and D. R. MacFarlane, "Room-Temperature Molten Salts Based on the Quaternary Ammonium Ion," J. Phys. Chem. B, pp. 8858-8864, 1998.
Kirk-Othmer, Encyclopedia of Chemical Technology, Fourth Edition, vol. 15, pp. 446-447, 1995.
Kirk-Othmer, Encyclopedia of Chemical Technology, Fourth Edition, vol. 3, pp. 1016-1109, 1992.
Ultraviolet Stabilizers, Modern Plastics World Encyclopedia, pp. C-120-C-122, 2001.

* cited by examiner

*Primary Examiner*—Stephen E Jones
(74) *Attorney, Agent, or Firm*—Samuel L. Borkowsky

(57) ABSTRACT

Radiofrequency attenuator and method. The attenuator includes a pair of transparent windows. A chamber between the windows is filled with molten salt. Preferred molten salts include quarternary ammonium cations and fluorine-containing anions such as tetrafluoroborate ($BF_4^-$), hexafluorophosphate ($PF_6^-$), hexafluoroarsenate ($AsF_6^-$), trifluoromethylsulfonate ($CF_3SO_3^-$), bis(trifluoromethylsulfonyl)imide (($CF_3SO_2)_2N^-$), bis(perfluoroethylsulfonyl)imide (($CF_3CF_2SO_2)_2N^-$) and tris(trifluoromethylsulfonyl)methide (($CF_3SO_2)_3C^-$). Radicals or radical cations may be added to or electrochemically generated in the molten salt to enhance the RF attenuation.

14 Claims, 1 Drawing Sheet

RADIOFREQUENCY ATTENUATOR AND METHOD

RELATED CASES

This application is a divisional of U.S. patent application Ser. No. 10/357,723 filed Feb. 3, 2003, now abandoned now allowed and incorporated by reference herein.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to attenuating electromagnetic radiation and more particularly to a transparent window that is filled with molten salt and that attenuates radiofrequency (RF) radiation.

BACKGROUND OF THE INVENTION

Electromagnetic (EM) noise in the RF and microwave (MW) range has become a serious problem for hospital buildings, computer centers, and other buildings where sensitive equipment is used. Most of these places present special problems because they have windows and doorways that admit EM noise from the outside and from one room to another. EM noise has also prompted health concerns relating to exposure from computer screens and other visual display devices (see, for example, U.S. Pat. No. 4,412,255 to Bruce E. Kuhlman and Marc A. Kamerling entitled "Transparent Electromagnetic Shield and Method of Manufacturing," which issued Oct. 25, 1983). With these problems and concerns, a need has emerged for new types of windows that can attenuate EM noise.

Conductive wire-mesh shields and glass panel shields with transparent metal coatings have been proposed as solutions to the noise problem for display devices. Wire-mesh shields may attenuate EM noise for monochrome display devices but can seriously degrade signal patterns and produce color shifts for dot matrix color displays. Glass panel shields are extremely costly and difficult to work with, and their panels tend to be thick and heavy. Other types of shields that attenuate RF radiation are described in the following patents.

U.S. Pat. No. 6,353,220 to D. R. Sar entitled "Shielding of Light Transmitter/Receiver Against High-Power Radio-Frequency Radiation", which issued Mar. 4, 2002, describes a method and apparatus for shielding a light transmitter or receiver from high-powered RF radiation using a window that contains water or brine.

U.S. Pat. No. 4,910,090 to B. E. Kuhlman et al. entitled "EMI/RFI Shield for Visual Display Terminals," which issued Mar. 20, 1990, describes a shield for use with visual displays.

U.S. Pat. No. 4,978,812 to K. Akeyoshi et al. entitled "Electromagnetic Wave Shielding Transparent Body," which issued Dec. 18, 1990, describes a shield having transparent conductive sheets.

There remains a need for transparent windows for visual display devices that attenuate RF radiation. There also remains a need for RF-attenuating windows for buildings.

Therefore, an object of the present invention is to provide a transparent RF attenuator.

Another object of the present invention is to provide a transparent, RF-attenuator for buildings and visual display devices.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the objects and purposes of the present invention, as embodied and broadly described herein, the present invention includes a radiofrequency attenuator. The attenuator includes a transparent container and a molten salt sealed inside the container. A preferred embodiment of the invention includes a container having a first transparent window, a second transparent window, and a chamber for receiving molten salt between the two windows.

The invention also includes a method for attenuating the transmission of RF radiation. The method includes filling a transparent container with molten salt and positioning the filled container along the path of RF radiation.

BRIEF DESCRIPTION OF THE DRAWINGS

The accompanying drawings, which are incorporated in and form a part of the specification, illustrate the embodiment(s) of the present invention and, together with the description, serve to explain the principles of the invention. In the drawings.

DETAILED DESCRIPTION OF THE INVENTION

Figure 2:
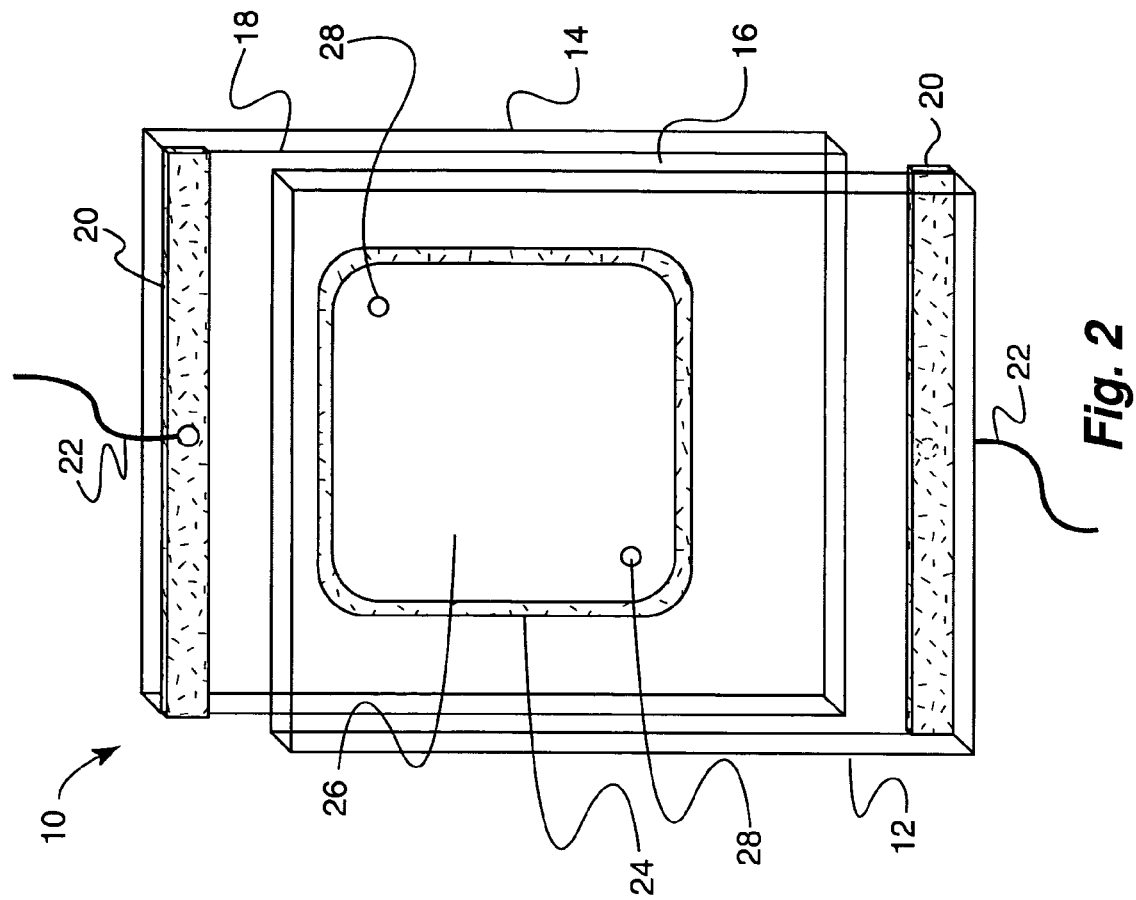
FIG. 2 shows a perspective view of the embodiment of FIG. 1.

The invention includes a transparent radiofrequency (RF) attenuator and a method for attenuating RF radiation. The attenuator is prepared by sealing a molten salt inside a transparent container. The container typically includes container walls made of transparent glass, quartz or plastic. A preferred container includes two transparent plate glass windows, each window being coated with indium tin oxide or fluorine-doped indium tin oxide. Indium tin oxide and fluorine-doped indium tin oxide are collectively referred to herein as ITO.

The molten salts used with the invention are transparent to ultraviolet and visible light, highly conductive, and thermally stable to the extremes of high and low temperatures of the external environment. Preferred cations of the molten salts include lithium cation and quarternary ammonium cations (see J. Sun et al., "Room Temperature Molten Salts Based on the Quarternary Ammonium Ion," J. Phys. Chem. B, 1998, vol. 102, pp. 8858-8864, incorporated by reference). Preferred quarternary ammonium cations include tetraalkylammonium, pyridinium, pyridazinium, pyrimidinium, pyrazinium, imidazolium, pyrazolium, thiazolium, oxazolium, and triazolium (see U.S. Pat. No. 5,827,602 to V. R. Koch et al. entitled "Hydrophobic Ionic Liquids," which issued Oct. 27,1998, incorporated by reference herein). The preferred molten salts remain as liquids in the temperature range of window operation.

Other preferred quarternary ammonium cations include those with the formula $[(CH_3CH_2)_3N(R_1)]^+$, wherein $R_1$ is alkyl having 2-10 carbons; or include those with the formula $[(CH_3)_2(CH_3CHCH_3)N(R_2)]^+$, wherein $R_2$ is alkyl having 2-10 carbons; or include those with the structural formula

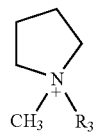

wherein $R_3$ is alkyl having 2-10 carbons; or include those with the structural formula

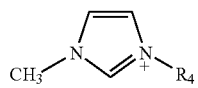

wherein $R_4$ is alkyl having 2-10 carbons.

Tetraalkylammonium cations are most preferred because they have the least optical absorbance in the ultraviolet portion of the spectrum, which gives ionic liquids that include tetraalkylammonium cations high photochemical stability.

Preferred anions of the molten salts include fluorine-containing anions, which include tetrafluoroborate ($BF_4^-$), hexafluorophosphate ($PF_6^-$), hexafluoroarsenate ($AsF_6^-$). Most preferred anions include trifluoromethylsulfonate ($CF_3SO_3^-$), bis(trifluoromethylsulfonyl)imide (($CF_3SO_2$)$_2N^-$), bis(perfluoroethylsulfonyl)imide (($CF_3CF_2SO_2$)$_2N^-$) and tris(trifluoromethylsulfonyl)methide (($CF_3SO_2$)$_3C^-$) because of their low cost and high hydrophobicity.

Soluble radicals (such as galvinoxyl radicals, trityl radicals, nitroxide radicals, nitronyl nitroxide radicals, semiquinone radicals, diaminobenzene radicals, ferrocenyl radicals, lanthanide radicals such as gadolinium (III), and the like) and radical cations such as methyl viologen radical cation may be added to or electrochemically generated in the molten salt to enhance the RF attenuation of the invention. Optionally, radicals and radical cations may be added to the molten salt or electrochemically generated in the molten salt to enhance the RF attenuation, such that the radicals, radical cations, or their precursors (tungsten oxide, iron oxide, lanthanide oxide radicals such as gadolinium oxide, for example) are employed as a solid layer adhered to ITO. For electrochemical generation, radical precursors are added to the molten salt and then a voltage is applied across the ITO layers. One ITO layer functions as the cathode and the other ITO layer as the anode. In addition the ions or compounds generated by electrochemical process may have redox properties which result in reversible change in electromagnetic-radiation transmission or reflection from the windows resulting in "electrochromic" devices. This change may be in optical range (UV, visible and Infra-red) and/or in the radio frequency range. The glass, quartz, or plastic substrate bearing the attached ITO may be roughened to reduce reflection from the electrode. Roughening the substrate also increases surface area, which has the effect of lowering the current density and improving electrode kinetics.

Figure 1:
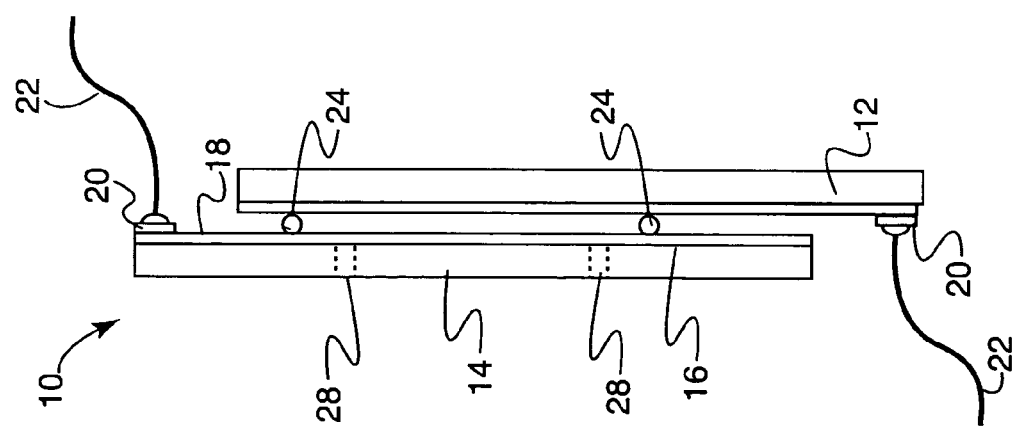
FIG. 1 shows an edge-on view of an embodiment of a radiofrequency attenuator of the invention.

Reference will now be made in detail to the present preferred embodiments of the invention. Similar or identical structure is identified using identical callouts. FIG. 1 shows an edge-on view of an embodiment of a radiofrequency (RF) attenuator of the invention. FIG. 2 shows a perspective view of the embodiment of FIG. 1. Attenuator 10 includes first substrate 12 and second substrate 14. For convenience, small flat pieces of glass were employed as substrates. It should be understood that the substrates are not limited to any particular shape. Curved substrates, for example, may also be used. First ITO layer 16 is attached to a face of first substrate 12 and second ITO layer 18 is attached to a face of second substrate 14. ITO is indium tin oxide, or fluorine doped indium tin oxide. Attenuator 10 includes metallic bus bars 20. One bus bar 20 is attached to an end portion of first ITO layer 16. Another bus bar 20 is attached to an end portion of second ITO layer 18. The bus bars are made from suitable conductive metallic material and provide good electrical contact to the ITO layers. Some examples are silver frits, solder alloys, metallic strips, wires and clips. Some example of preferred metals are copper, copper-beryllium and tin plated copper. Wires 22 are soldered or otherwise attached to bus bars 20 for connecting to a voltage source (a battery or the like). Attenuator 10 includes gasket 24, which is electrically non-conductive (if the two layers 16 and 18 are used to electrically activate the device) and may be a polymer adhesive, an o-ring, or the like. Gasket 24 forms a seal with first ITO layer 16 and with second ITO layer 18 to provide chamber 26. Preferably, the chamber width between the substrates is from about 50 microns to about 5000 microns. More preferably, the chamber width is from about 50 microns to about 500 microns.

If ITO layers 16 and 18 are omitted, the resulting embodiment of the invention would include gasket 24 forming a seal with substrate 12 and substrate 14.

Gasket 24 should be chemically stable to molten salt electrolyte used with the invention, substantially impermeable to water and the atmosphere, and robust over a wide temperature range. Optionally, a small volume of gas may be included within chamber 26 to assist with mechanical expansion and contraction.

First ITO layer 16, second ITO layer 18, bus bars 20, wires 22, and the voltage source (not shown) are used to electrochemically generate radicals in situ, and are all optional.

Attenuator 10 includes ports 28 for filling chamber 26 with molten salt electrolyte and optional radicals. Optionally, dispersed inorganic materials may be added to the molten salt electrolyte. These materials, which include silica or alumina, are electrochemically inert and may form thixotropic gels to assist with injection of the molten salt electrolyte. After filling the chamber, ports 28 are plugged.

The molten salt electrolyte is non-volatile and hydrophobic, and provides high concentrations of cations and anions that offer minimal resistance to current. The electrolyte remains in electrical contact with first ITO layer 16 and second ITO layer 18.

Additive organic radicals or organic radical precursors may be added to the molten salt. If radical precursors are used, they may be converted to radicals by applying an appropriate voltage between first ITO layer 16 and second ITO layer 18. The radicals enhance the RF attenuation properties of attenuator 10. Organic radicals include neutral organic radicals such as galvinoxyl, organic radical cations such as methyl viologen, and the like. The radicals may be colored or colorless. The radicals may be soluble or insoluble in the molten salt. UV stabilizers may also be dissolved in the electrolyte; examples of these can be found in Modern Plastics World Encyclopedia (2001) p-C-120 to C-122, Chemical Week Publishing, NY, incorporated by reference herein.

Additive stiffening agents may also be added to the molten salt electrolyte. These stiffening agents tend to increase the viscosity of the electrolyte without changing ionic conductivity. Stiffening agents include, but are not limited to, organic polymers such as polyacrylonitrile, polyvinylalcohol, polyvinylacetate and polymethylacrylate. These polymers may be formed in situ. Polymethylacrylate, for example, may be formed by adding methylacrylate to the molten salt and then adding benzoylperoxide to initiate the polymerization.

Such windows may also be used in standard window assemblies where one of the panes in a multi-pane window is substituted by a molten salt filled laminate window as described above. Further, one or more of the conductive layers (e.g. 16 and 18 in FIG.) may be connected to a metallic window frame or be grounded to increase the RF absorption.

The following examples further illustrate embodiments of the invention.

EXAMPLE 1

An RF attenuator of the invention was constructed using two rectangular plates, 5.25" long, 3.7" wide. A layer of indium-tin oxide (ITO) having a sheet resistivity of 7Ω/square was attached to one side of each plate. Two fill holes about 3 mm in diameter were drilled near the corners along a diagonal of one plate. The plates were washed and dried. An epoxy containing 105-micron glass bead spacer was placed around the edges of one plate and the other plate was placed on top of it, slightly off center to make a long edge of each plate accessible for attaching a bus bar and making electrical connections. The spacer provided a chamber width of 105 microns. The epoxy spacer was cured at 120° C. to seal the spacer to the plates and form a chamber between the plates. The chamber was filled with a solution of 1-butyl-3-methylimidazolium bis(trifluoromethanesulfonyl)imide containing about 0.015 M methyl viologen bis(trifluoromethanesulfonyl)imide and about 0.015 M N,N,N',N'-tetramethyl-1,4-phenylenediamine (an example of a diaminobenzene). The fill holes were plugged and sealed. A solder strip was attached along the accessible long side of each ITO layer using an ultrasonic solder. Electrical wires were then attached to these solder strips.

The RF attenuator was tested using a cellular phone and a stainless steel vessel. The cellular phone was placed in the vessel. After dialing the cellular phone number, the cellular phone rang. Next, with the cellular phone still in the pot, the RF attenuator was positioned over the open face of the vessel. After dialing the cell phone with the open face of the vessel substantially blocked by the attenuator, the cell phone did not ring.

EXAMPLE 2

The attenuator of Example 1 was repositioned so that it only partially blocked the open face of the vessel. In this position, when the cellular phone number was dialed, the phone rang. Next, a voltage was applied between the ITO layers sufficient to electrochemically, reductively, generate the radical cation of the methyl viologen bis(trifluoromethanesulfonyl)imide salt and oxidatively generate the radical cation of the N,N,N',N'-tetramethyl-1,4-phenylenediamine. The cellular phone number was dialed again but did not ring. This indicated that radicals dissolved in the molten salt electrolyte enhanced RF attenuation.

EXAMPLES 3-6

Four RF attenuators were prepared. Each one was constructed using two 5.25"×3.7" rectangular indium-tin oxide (ITO) coated glass plates (7Ω/square). Two holes about 3 mm in diameter were drilled near the corners along a diagonal of one plate. The plates were washed, dried and stored. An epoxy containing 105-micron glass bead spacer was dispensed around the edges of one plate and the other plate was placed on top of it, slightly off center to make a long edge of each plate accessible for attaching a bus bar and making electrical connections. The epoxy spacer was cured at 120° C. to form a seal.

A different electrolyte solution was used for each attenuator. After filling the chamber between the plates with electrolyte solution, the fill holes were plugged and sealed. A solder strip was attached as described in Example 1.

The electrolyte solution of Example 3 was a solution of 1 molar (M) lithium triflate in propylene carbonate.

The electrolyte of Example 4 was 1-butyl-3-methylimidazolium bis(trifluoromethanesulfonyl)imide.

The electrolyte solution of Example 5 was a solution of about 0.05 M methyl viologen. bis(trifluoromethanesulfonyl)imide salt and about 0.05M ferrocene in 1-butyl-3-methylimidazolium bis(trifluoromethanesulfonyl)imide. This resulted in reversible electrochromic properties when 1 volt was applied between the two ITO coatings.

The electrolyte solution of Example 6 was a solution of about 0.5 M lithium bis(trifluoromethanesulfonyl)imide and about 0.05M ferrocene in 1-butyl-3-methylimidazolium bis (trifluoromethanesulfonyl)imide. The attenuator of Example 6 also included a tungsten oxide coating, about 350 nm thick, on one of the ITO layers. This also resulted in reversible electrochromic properties when the ITO in contact with the tungsten oxide was at a negative one volt compared with the opposite electrode.

The attenuators of Examples 3-6 were then tested for attenuation of radio waves between about 1.5 GHz and about 40 GHz. The results now follow.

The attenuator of Example 4 attenuated the RF radiation better than the attenuator of Example 3. The difference in attenuation in decibels for a particular wavelength range is shown in Table 1 below.

TABLE 1

| Wavelength (GHz) | Attenuation Difference (decibels) |
|---|---|
| 26.5-40 | 5 |
| 18-26.5 | 5 |
| 12.4-18 | 4 |
| 8.2-12.4 | 3 |
| 7.8-8.2 | 3 |
| 6.4-6.7 | <8 |
| 2.9-3.3 | 5-13 |

The attenuator of Example 5 became more effective when it was electrically charged; the difference in decibels for a particular wavelength range is shown in Table 2 below.

TABLE 2

| Wavelength (GHz) | Attenuation difference (decibels) |
|---|---|
| 6.2-6.8 | 1-3 |
| 2.5-2.6 | 4-5 |

Similarly, the attenuator of Example 6 became more effective when it was electrically charged; the difference in decibels for a particular wavelength range is shown in Table 3 below.

TABLE 3

| Wavelength (GHz) | Attenuation difference (decibels) |
|---|---|
| 5.2-5.4 | 2-3 |
| 3.7-4 | 5 |
| 3.1-3.23 | 5-11 |
| 1.5-2.6 | 2-8 |

Organic liquids have been used with RF attenuators but present problems that include low solubility of charge carriers, low boiling points, toxicity, poor electrochemical stability and photostability. RF attenuators of the invention employ molten salt electrolytes that have minimal vapor pressure, excellent conductivity, high boiling points, low toxicity, excellent electrochemical stability and photostability, and can be prepared with water content less than 1 ppm. With these properties in mind, RF attenuators of the invention can be used with, or instead of, more conventional but less effective windows for buildings to reduce the amount of electromagnetic noise that enters a building from the outside, or that moves from room to room. They are also excellent RF-attenuating shields for computer screens and other visual display devices.

The foregoing description of the invention has been presented for purposes of illustration and description and is not intended to be exhaustive or to limit the invention to the precise form disclosed, and obviously many modifications and variations are possible in light of the above teaching.

The embodiment(s) were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for attenuating radiofrequency radiation, comprising filling a substantially transparent container with molten salt and positioning the container in the path of radiofrequency radiation, whereby radiofrequency radiation entering the container of molten salt is attenuated.

2. The method of claim 1, wherein the transparent container comprises in combination:
   (a) a first transparent window;
   (b) a second transparent window opposite said first transparent window; and
   (c) a chamber for receiving molten salt between said first transparent window and said second transparent window.

3. The method of claim 2, wherein the first transparent window and the second transparent window comprise ITO.

4. The method of claim 2, wherein the chamber comprises a chamber width of about 50-5000 microns between the first transparent window and the second transparent window.

5. The method of claim 2, wherein the chamber comprises a chamber width of about 50-500 microns between said first transparent window and said second transparent window.

6. The method of claim 2, wherein the quaternary ammonium cations are selected from the group consisting of pyridinium, pyridazinium, pyrimidinium, pyrazinium, imidazolium, pyrazolium, thiazolium, oxazolium, triazolium, tetraalkylammonium, and N-methyl morpholinium.

7. The method of claim 2, wherein the molten salt comprises at least one anion selected from the group consisting of tetrafluoroborate ($BF_4^-$), hexafluorophosphate ($PF_6^-$), hexafluoroarsenate ($AsF_6^-$), trifluoromethylsulfonate ($CF_3SO_3^-$), bis(trifluoromethylsulfonyl)imide (($CF_3SO_2$)$_2$N$^-$), bis(perfluoroethylsulfonyl)imide (($CF_3CF_2SO_2$)$_2$N$^-$) and tris(trifluoromethylsulfonyl)methide (($CF_3SO_2$)$_3$C$^-$).

8. The method of claim 2, wherein the transparent container further comprises means for applying voltage between said first transparent window and said second transparent window.

9. The method of claim 2, wherein the molten salt comprises at least one cation selected from the group consisting of lithium cation and quaternary ammonium cations.

10. The method of claim 9, wherein the quaternary ammonium cations have the formula [$(CH_3CH_2)_3N(R_1)$]$^+$, wherein $R_1$ is alkyl having 2-10 carbons; or have the formula [$(CH_3)_2(CH_3CHCH_3)N(R_2)$]$^+$, wherein $R_2$ is alkyl having 2-10 carbons; or have the structural formula

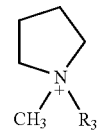

wherein $R_3$ is alkyl having 2-10 carbons; or have the structural formula

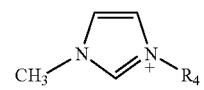

wherein $R_4$ is alkyl having 2-10 carbons.

11. The method of claim 2, further comprising radicals sealed inside the chamber with the molten salt.

12. The method of claim 11, wherein the radicals are soluble in the molten salt.

13. The method of claim 11, wherein the radicals are insoluble in the molten salt.

14. The method of claim 11, wherein the radicals are selected from the group consisting of galvinoxyl radicals, trityl radicals, nitroxide radicals, nitronyl nitroxide radicals, semiquinone radicals, diaminobenzene radicals, ferrocenyl radicals, viologen radical cations, lanthanide radicals, and metal oxide radicals.

* * * * *